United States Patent [19]

Alpha et al.

[11] Patent Number: 4,816,299

[45] Date of Patent: Mar. 28, 1989

[54] ENCAPSULATING COMPOSITIONS CONTAINING ULTRA-PURE, FUSED-SILICA FILLERS

[75] Inventors: James W. Alpha, Corning; Paul M. Schermerhorn, Painted Post; Michael P. Teter, Corning, all of N.Y.

[73] Assignee: Corning Glass Works, Corning, N.Y.

[21] Appl. No.: 52,655

[22] Filed: May 20, 1987

[51] Int. Cl.⁴ .................. B05D 7/00; C03B 23/20; C04B 5/00; C08L 63/00
[52] U.S. Cl. ........................ 427/221; 65/17; 65/18.1; 65/901; 523/443; 523/466
[58] Field of Search ............... 427/221, 227, 379, 386; 523/443, 466; 65/17, 18.1, 901

[56] References Cited

U.S. PATENT DOCUMENTS

| | | | |
|---|---|---|---|
| 3,535,890 | 10/1970 | Hansen | 65/18 |
| 3,678,144 | 7/1972 | Shoup | 264/42 |
| 4,042,361 | 8/1977 | Bihuniak | 65/18 |
| 4,042,550 | 8/1977 | Tuller | 260/37 EP |
| 4,112,032 | 9/1978 | Blaszyk | 264/42 |
| 4,200,445 | 4/1980 | Bihuniak | 65/18 |
| 4,287,105 | 9/1981 | Rosler | 260/18 EP |
| 4,419,115 | 12/1983 | Johnson | 65/3.12 |
| 4,426,216 | 1/1984 | Satoh et al. | 65/18.1 |
| 4,574,063 | 3/1986 | Scherer | 264/60 |
| 4,608,215 | 8/1986 | Gonczy et al. | 264/56 |
| 4,622,056 | 11/1986 | Matsuo | 65/18.1 |
| 4,681,615 | 7/1987 | Toki et al. | 65/18.1 |

FOREIGN PATENT DOCUMENTS

| | | |
|---|---|---|
| 84438 | 7/1983 | European Pat. Off. |
| 2041913 | 9/1980 | United Kingdom |
| 2170799 | 8/1986 | United Kingdom |

OTHER PUBLICATIONS

A. Robinson, *Science*, 208:1246–1249, Jun. 13, 1980.
Scherer et al., *Journal of Non-Crystalline Solids*, 63:163–172 (1984).
W. Twaddell, *EDN*, Nov. 20, 1980, pp. 53–54.

*Primary Examiner*—Michael Lusignan
*Attorney, Agent, or Firm*—Walter S. Zebrowski; Maurice M. Klee

[57] ABSTRACT

Compositions for encapsulating electronic components are provided which comprise a blend of a curable resin and an ultra-pure silica filler. The filler is composed of fused silica granules which are prepared from a gel of a silicon-containing organic compound, such as TEOS, and which have a uranium content of less than about 0.1 parts per billion and a thorium content of less than about 0.5 parts per billion. The compositions can be readily manufactured in commercial quantities at reasonable costs and are particular well-suite for encapsulating components, such as, high density RAMs, which are sensitive to alpha particles.

9 Claims, 2 Drawing Sheets

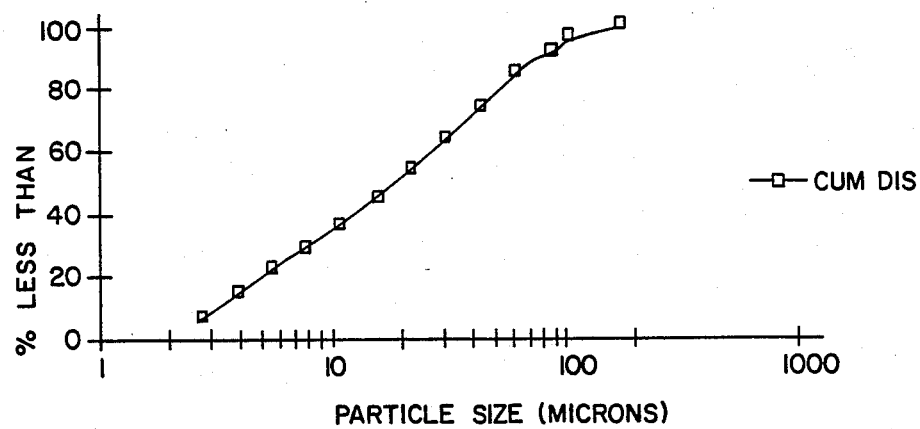

ized Tran-
ENCAPSULATING COMPOSITIONS CONTAINING ULTRA-PURE, FUSED-SILICA FILLERS

BACKGROUND OF THE INVENTION

1. Field of the Invention

This invention relates to compositions for encapsulating electronic components and, in particular, to compositions which contain ultra pure, fused silica fillers having low concentrations of radioactive contaminants.

2. Description of the Prior Art

Quartz, silica, and fused silica in powder form have been used for many years as fillers for encapsulating electronic components, such as, semiconductor memory devices. See, for example, Tuller et al., U.S. Pat. No. 4,042,550, and Rosler et al., U.S. Pat. No. 4,287,105. These fillers provide strength and low thermal expansion to the component package and are chemically inert.

As electronic components and, in particular, solid state memory chips, have become more complex and larger in capacity, they have become more sensitive to radioactive particles, in particular, alpha particles. See A. Robinson, "Problems with Ultraminiaturized Transistors", *Science,* 208:1246–1249, June 13, 1980; and W. Twaddell, "Upcoming High-Density-RAM Designs Must Fend Off Alpha-Particle Assaults," EDN, Nov. 20, 1980, pages 53–54.

For example, in the case of high density random access memories (RAMs), the passage of an alpha particle through the component can cause "soft" errors by changing the state of individual memory cells. The presence of radioactive elements in the filler materials used in encapsulating compositions for electronic components has been identified as a major source of such alpha particles. In particular, the uranium and thorium levels in existing silica fillers have been identified as significant sources of alpha particles.

Although this problem has been recognized for many years (see Robinson, supra, and Twaddell, supra), it has proved to be difficult to lower the levels of uranium and thorium in existing silica fillers. In particular, it has only been possible to achieve uranium levels on the order of 0.5 ppb under laboratory conditions, and then only for small samples at high cost.

The use of sol-gel techniques to produce fused silica articles, such as optical waveguides, has been considered in the past. In particular, the use of silicon-containing organic compounds, such as, tetraethylorthosilicate (TEOS) for such purposes has been disclosed. See Matsuyama et al., UK Patent Application No. GB No. 2,041,913.

The preparation of fused silica particles from a gel formed from fumed silica has been also been disclosed. Specifically, Bihuniak et al., U.S. Pat. Nos. 4,042,361, and 4,200,445, describe processes for densifying fumed silica and other fumed metal oxides by forming a sol, drying the sol to form fragments, and densifying the fragments by calcining them at 1150°–1500° C. Thereafter, the densified material can be milled, e.g., to an 8 to 10 micron average particle size.

Because it employs fumed silica, the Bihuniak et al. process is more difficult to perform than the process of the present invention. For example, it is relatively difficult to form gels from fumed silica, and as acknowledged in the Bihuniak et al. patents, once formed, gels made from fumed silica tend to break up into large chunks, rather than small particles. Further, extensive pollution abatement equipment is required to produce fumed silica since such production involves the creation of hydrochloric acid.

In addition, densified silica particles made from fumed silica generally have higher impurity levels than densified silica particles prepared in accordance with the present invention. These higher impurity levels are due in part to the fact that impurities, including radioactive impurities, are introduced into the silica during the fuming process.

The higher impurity levels also arise from the fact that densification of particles made from fumed silica gels requires higher temperatures than densification of particles formed from gels made from silicon-containing organic compounds, i.e., densification of particles made from fumed silica gels require temperatures above, rather than below, 1150° C. Such higher temperatures generally mean that metal-containing furnaces must be used to perform the densification. The use of such furnaces, in turn, means that the silica particles will be exposed to and thus will pick up contaminants released from the walls of the hot furnace. In addition to the purity problem, the need to generate higher temperatures to achieve densification is in general undesirable.

SUMMARY OF THE INVENTION

In view of the foregoing state of the art, it is an object of the present invention to provide improved compositions for encapsulating electronic components. In particular, it is an object of the invention to provide encapsulating compositions which include a silica filler which (a) can be produced in commercial quantities at reasonable costs and (b) whose uranium and thorium concentrations are below those of existing commercially-available silica fillers.

To achieve the foregoing and other objects, the invention provides encapsulating compositions which comprise a blend of a curable resin and a silica filler, the filler being composed of fused silica granules which: (a) are prepared from a silicon-containing organic compound using a sol-gel process, and (b) have a uranium content of less than about 0.1 parts per billion and a thorium content of less than about 0.5 parts per billion.

In certain preferred embodiments, the silicon-containing organic compound is tetraethylorsilicate (TEOS) having the formula $Si(OC_2H_5)_4$, and the granules are dry milled so that they have a mean particle size between about 1 and about 100 microns.

The principles of the invention, as well as its preferred embodiments, are explained and illustrated by the accompanying figures and the examples presented below. These figures and examples, of course, are for purposes of illustration only and are not intended to limit the scope of the invention.

BRIEF DESCRIPTION OF THE DRAWINGS

FIG. 3 shows a typical particle size distribution for the fully sintered and milled silica granules of the present invention.

DESCRIPTION OF THE PREFERRED EMBODIMENTS

Figure 1:
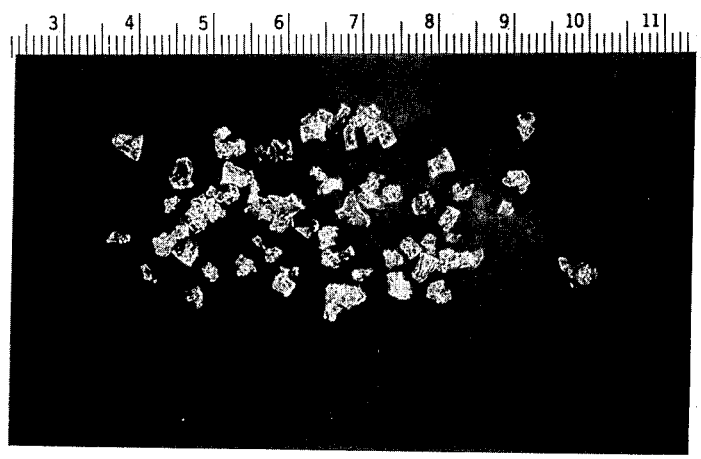
FIGS. 1 and 2 show the appearance of the silica granules of the present invention before and after sintering, respectively. The numbers on the scales shown in these figures represent centimeters.

As discussed above, the present invention involves the production of ultra-pure silica fillers using a sol-gel process.

The sol-gel process employs at least one silicon-containing organic compound having the formula $Si(OR)_4$ or $SiR(OR)_3$, where R is an alkyl group. Tetraethylorthosilicate ("TEOS"), having the formula $Si(OC_2H_5)_4$, is the preferred silicon-containing organic compound, although other organosilicon compounds, including, for example, tetramethylorthosilicate having the formula $Si(OCH_3)_4$, and methyltrimethoxysilane, having the formula $SiCH_3(OCH_3)_3$, can be used. The silicon-containing organic compound can be partially hydrolyzed. For example patially hydrolyzed TEOS sold by the Stauffer Chemical Company under the trademark SILBOND 40 is a suitable starting material for preparing the gels of the present invention. In general, the use of a single silicon-containing organic compound is preferred, although mixtures of such compounds can be used, if desired.

A solution of the silicon-containing organic compound is prepared and then gelled. Preferably, the solution is an aqueous solution which includes an acid, such as, hydrochloric acid, as a gelation catalyst. Other solvents, e.g., organic solvents such as ethanol, can be added to improve miscibility, and other gelation catalysts, e.g., acids such as formic and nitric acid, can be used.

In the case of TEOS, water to TEOS mole ratios in the range of 4:1 to 15:1 have been found to work successfully. Theoretically, ratios as low as 2:1 can be employed. Higher ratios produce gels having larger surface areas and pore sizes which are easier to dry. In some cases, for higher ratio gels, drying alone has been found to sufficiently reduce the level of organic material within the gel, so that oxygen treatment of the gel can be omitted. The higher ratio gels, however, mean that less product is produced for the same size reaction vessel. In general, a mole ratio of 6:1 has been found to produce a reasonable amount of product which can be readily dried.

The solution of the organosilicon compound is preferably gelled in a quartz reactor or similar vessel. Gelation results in (1) polymerization of the silicon, and (2) the production of an alcohol, such as, ethanol in the case of TEOS. Typical gelation times for a solution pH in the range of 1-2 are in the range of 1-4 hours at a temperature of from 60° C. to 75° C. Gelation times can be reduced by heating the organosilicon solution. Also, if desired, high speed gelation can be achieved by neutralizing the pH of the TEOS solution through the addition of a basic solution, such as, a 1.2% ammonium carbonate solution. Gelation times in the range of seconds can be achieved in this way.

Once gelation has been completed, the gel is dried to (1) remove residual water and alcohol (carbon), and (2) fragment the gel into granules having a mean particle size less than about 1 millimeter. The drying can be conveniently performed in the same reactor used to prepare the gel, or the gel can be removed and dried in specialized drying equipment, e.g., in a rotary dryer or rotary vacuum dryer.

When the drying is performed in the reactor used to prepare the gel, drying temperatures above about 250° C. are preferred. At such temperatures, drying times on the order of 30 hours are typical. To remove the water and alcohol, the gel is either purged with an inert atmosphere, e.g., an argon atmosphere, or subjected to a vacuum. Purging and vacuum treatments can be used sequentially, if desired.

When the drying is performed using a rotary dryer or a rotary vacuum dryer, temperatures above the boiling point of water, e.g., on the order of 120° C., have been found to be adequate. In the case of vacuum rotary dryers, it has been found that vacuum should not be applied to the gel at the beginning of the drying process since it causes the gel to collapse which impedes the removal of water and organics. Vacuum, however, can be used at the end of the drying process where it does help in the removal of water and organics. Typical drying times when either a rotary or rotary vacuum dryer are used are on the order of 8 hours. It has been observed that smaller granules are produced by rotary drying than by bulk drying in the reactor in which the gel was produced.

In addition to the foregoing methods, drying can be accomplished by forming the gel in thin sheets and allowing the sheets to dry at room temperature. The thin sheet approach, however, is not preferred for commercial production.

Depending on the characteristics of the gel and the particular drying conditions employed, drying alone may reduce the level of organics associated with the granules to a point where charred carbon particles do not form upon sintering of the granules. Alternatively, the organics can be removed by purging the gel granules with an oxygen-containing atmosphere at an elevated temperature. To avoid the production of charred carbon particles during this process, the rate of oxygen purging must be controlled so that the exothermic reaction between oxygen and organics does not cause the temperature of the drying chamber to rise above about 340° C.

In the case of gels formed from TEOS, depending on the $H_2O$:TEOS ratio, the amount of acid catalyst used, and the specific drying protocol employed, the dried gel granules will typically have a density of approximately 1.29–1.59 grams/cc, a pore size of approximately 20–100 angstroms, and a surface area to mass ratio of between about 150 and about 700 meter$^2$/gram.

For comparison, if fumed silica is used as the starting material, the resulting dried gel will have a lower density of approximately 0.31–0.88 grams/cc and a larger pore size of approximately 700–1000 angstroms. Moreover, the drying of such a fumed silica gel will generally not produce granules having a mean particle size less than one millimeter, but rather, will produce larger particles and chunks which are not well-suited for further processing.

Once the gel has been dried and thus fragmented, the gel granules are fully sintered, i.e., they are sintered to a density which is approximately equal to their maximum theoretical density. The sintering process causes various changes in the character of the gel granules. Specifically, during sintering, the polymeric structure of the gel granules relaxes, water is given off (condensation reaction) which, in turn, affects the granules' apparent viscosity, and the pores of the granules collapse. Overall, the sintering process results in a dramatic decrease in surface area to mass ratio of the granules, i.e., from the 150–700 meter$^2$/gram range to a value less than 0.5 meter$^2$/gram.

The sintering of the gel granules is conducted at a temperature of less than about 1150° C. This low sintering temperature allows the sintering to be conducted in the same quartz reactor used for gelation and drying. The use of such reactor, as opposed to a metal furnace, helps maintain the purity of the granules through the sintering procedure. Alternatively, if the gel has been removed from the original quartz reactor for drying, it can be returned to a silica-based reactor for sintering.

For comparison, to sinter a gel formed from fumed silica requires temperatures well above 1150° C., e.g., in the range of 1250–1450° C. This difference in sintering temperatures is due primarily to the fact that the pore size for gels made from fumed silica is generally on the order of 700 angstroms, while the pore size for gels made from silicon-containing organic compounds is generally less than about 100 angstroms. As known in the art, sintering temperature generally decreases with decreasing pore size. See Scherer et al., "Glasses from Colloids", *Journal of Non-Crystalline Solids*, 63:163–172 (1984).

The sintering can be performed in a variety of atmospheres. For example, helium, helium/oxygen, and argon/oxygen atmospheres can be used. In some cases, a helium atmosphere has been found preferable to an argon/oxygen atmosphere. The sintering can also be performed in air.

A sintering period of approximately one hour at temperatures in the 900–1000° C. range is generally sufficient to achieve full densification of the granules. The specific temperature needed will depend on pore size of the gel. The pore size, in turn, will depend on the $H_2O$:TEOS ratio used to produce the gel. As illustrated in Table I, higher mole ratios result in gels having larger surface areas but lower densities. Accordingly, the pore sizes for these gels are greater and thus higher sintering temperatures are required to achieve full densification.

Sintering temperature is also affected by the amount of chemically bound water associated with the granules. For example, it has been found that if the water level in a gel has been reduced by means of a chlorine gas treatment, high sintering temperatures, e.g., temperatures 100–150° C. higher, are required to obtain full densification of the granules.

A further discussion of the foregoing technique for producing ultra-pure, fused silica granules can be found in copending application Ser. No. 052,619, which is entitled "Method for Producing Ultra-High Purity, Optical Quality, Glass Articles" and which is being filled simultaneously herewith. The pertinent portions of this application are incorporated herein by reference.

In some cases, the fully sintered gel granules will be suitable for use in preparing the encapsulating compositions of the present invention without any further processing. In other cases, it may be desirable to reduce the size of the granules prior to use. In general, particles having a mean particle size in the range of from about 1 micron to about 100 microns are preferred. More particularly, particles which will pass through a 325 mesh screen, but will not pass through a 600 mesh screen, are particularly well-suited for use as a filler material.

The reduction in size of the gel granules can be readily accomplished by a variety of milling techniques, including vibra-milling, ball milling, jet impingement or fluid energy milling, triter milling, and the like. Combinations of these milling techniques can also be used. In general, dry milling is preferred to wet milling, although milling in a solvent, such as, an alcohol, can be employed. If desired, the milling can be performed prior to sintering of the granules.

The encapsulating compositions of the present invention are prepared by blending the consolidated and sized gel granules with a curable resin suitable for encapsulating electronic components. Various resins, known in the art, can be used, the preferred resins being epoxy resins which are used in combination with a hardener and a catalyst. In addition, as is standard in the art, the blend can optionally include flame retardants, lubricants, colorants, coupling agents, and the like. A general discussion of suitable resins, additives, and formulation techniques can be found in the Rosler et al. and Tuller et al. patents referred to above, the pertinent portions of which are incorporated herein by reference.

In general, the fused silica granules of the present invention will comprise between about 10 and about 80 percent by weight of the final composition. If desired, the filler of the invention can be used in combination with other fillers, e.g., fumed silica, provided such other fillers are not used in large amounts and do not contain excessively high concentrations of radioactive materials.

After blending, the encapsulating composition will typically be densified on a hot differential roll mill or similar apparatus and then granulated. The resulting powder is then ready for use in accordance with conventional molding techniques.

Based on the foregoing description, the invention will now be further illustrated by the following example.

EXAMPLE

This example illustrates the preparation of the ultra-pure, fused silica filler of the present invention.

21.14 kilograms of TEOS (Eastmann Kodak Chemical Company, Rochester, N.Y.), was filtered through a 0.6 micron filter (Pall Company, Cortland, N.Y.) into a 50 liter polyethylene container. 9.072 kilgrams of deionized (DI) water, which had been filtered through a Millipore filter (pore size = 0.2 microns), was combined with 0.0209 kilograms of hydrochloric acid (Fisher Scientific Company, Rochester, N.Y.). This mixture was also filtered through the Pall filter and then added to the TEOS. The resulting mixture was stirred until a temperature of 65°–75° C. was reached, and then transferred to a quartz reactor and allowed to gel. If desired, the mixture can be filtered through a 2.5 micron filter before being transferred to the quartz reactor.

Drying and sintering of the gel was performed as follows. First, the reactor was placed in a furnace and the temperature of the furnace was raised to 100° C. at a rate of 100° C./hour. During this initial heating, the reactor was purged with argon at a rate of 200 cc/minute. The argon, as well as all other gases used in the process, was filtered through a 0.6 micron Pall filter before being introduced into the reactor.

The furnace was held at 100° C. for a half an hour, and then raised to 300° C. at a rate of 50° C./hour. The argon purging rate was increased to 800 cc/minute during this second heating phase. When the temperature of the gel reached 290° C., the furnace was cooled to 250° C. At this point, the gel had completely fragmented into fine granules having a mean size of less than about 1 millimeter and a surface area to mass ratio of approximately 200 meter$^2$/gram.

Using a computer-controlled feedback loop, oxygen was then introduced into the reactor at a rate such that the temperature of the reactor did not exceed 340° C. as a result of the exothermic reaction between the oxygen and the residual organics associated with the gel. Alternatively, oxygen was introduced into the reactor in accordance with a 10 cc/minute/hour ramp up to a maximum of 200 cc/minute. This rate of oxygen introduction was also found to control the oxygen-organic reaction so as to avoid the formation of charred carbon particles.

The oxygen treatment was continued until the temperature of the gel dropped below 300° C., at which point the temperature of the furnace was ramped to 400° C. at a rate of 25° C./hour. The temperature of the furnace was held at 400° C. for 4 hours. FIG. 1 shows the typical appearance of the granules at this stage of the process.

Figure 2:
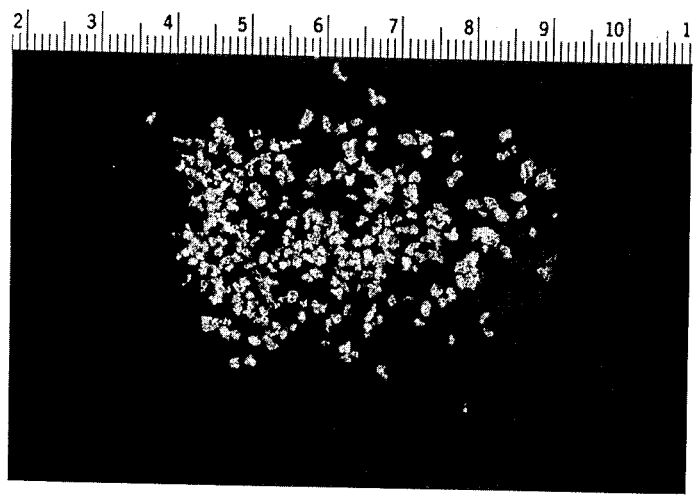

After the four hour holding period at 400° C., the temperature of the furnace was raised to 925° C. at a rate of 75° C./hour to fully sinter the granules. After the sintering, the granules had (1) a smaller mean size than before sintering, e.g., a mean size on the order of 0.6 millimeters, and (2) a reduced surface area to mass ratio on the order of 0.08 meter$^2$/gram. FIG. 2 shows the typical appearance of the fully sintered granules.

The overall process from initial preparation of the TEOS solution to final sintering of the granules took less than 100 hours. The yield of the process was approximately 99%.

As indicated above, fully sintered granules prepared in accordance with the above procedure have a mean particle size of approximately 0.6 mm. To reduce the size of these particles, the granules were dry milled in a vibra-mill for approximately 4 hours. The resulting granules were found to pass through a 325 mesh screen, but not a 600 mesh screen, and thus are suitable for use as a silica filler. FIG. 3 shows a typical distribution curve for milled particles prepared in accordance with the foregoing procedures.

Neutron activation analysis was performed on a sample of milled granules prepared essentially in accordance with the foregoing procedure. The results of this analysis is shown in Table II. As shown therein, only trace amounts of the listed elements were detected in the sample. In particular, the concentrations of uranium and thorium were found to be below 0.1 ppb and 0.5 ppb, respectively.

TABLE I

| Sintering Temperature (°C.) | Water:TEOS Mole Ratio | | |
|---|---|---|---|
| | 5 to 1 | 10 to 1 | 15 to 1 |
| | Surface Area (M$^2$/gram) | | |
| 400 | 192 | 596 | 673 |
| 500 | 150 | 560 | 663 |
| 600 | 122 | 475 | 548 |
| 700 | 118 | 398 | 443 |
| 800 | 13 | 206 | 354 |
| 900 | <0.5 | 4 | 88 |
| 950 | — | — | <0.5 |
| Density before sintering (gm/cm$^3$) | 1.529 | — | 1.290 |

TABLE II

| Neutron Activation Analysis of Silica Filler (parts per million) | |
|---|---|
| Titanium | <35.0 |
| Tin | <0.5 |
| Iodine | <0.003 |
| Manganese | 0.322 ± 5.0% |
| Copper | <0.6 |
| Vanadium | <0.02 |
| Chlorine | <0.3 |
| Aluminum | 20.937 ± 1.0% |
| Mercury | <0.0015 |
| Samarium | <0.0001 |
| Tungsten | <0.7 |
| Molybdenum | <0.009 |
| Uranium | <0.0001 |
| Lanthanum | <0.0004 |
| Cadmium | <0.017 |
| Arsenic | <0.001 |
| Antimony | <0.0001 |
| Zirconium | <0.4 |
| Bromine | 0.0038 ± 15.0% |
| Sodium | 0.259 ± 10.0% |
| Potassium | <100.0 |
| Cerium | <0.0015 |
| Calcium | <5.0 |
| Lutetium | <0.001 |
| Europium | <0.005 |
| Selenium | <0.010 |
| Terbium | <0.0006 |
| Thorium | <0.0005 |
| Chromium | 0.002 ± 20.0% |
| Ytterbium | <0.004 |
| Hafnium | <0.001 |
| Barium | <0.1 |
| Neodymium | 0.013 ± 20.0% |
| Cesium | <0.0005 |
| Silver | <0.002 |
| Nickel | <0.45 |
| Scandium | 0.00003 ± 15.0% |
| Rubidium | <0.005 |
| Iron | 0.258 ± 20.0% |
| Zinc | <0.025 |
| Cobalt | 0.0017 ± 12.0% |

We claim:

1. A method for producing an encapsulating composition having a low concentration of uranium and thorium comprising the steps of:
   (a) preparing a solution which contains an effective amount of at least one silicon-containing organic compound having the formula Si(OR)$_4$ or SiR(OR)$_3$, where R is an alkyl group;
   (b) polymerizing the silicon in the solution to form a SiO$_2$ gel;
   (c) drying the gel at a rate which causes the gel to fragment into granules having a mean particle size less than about one millimeter;
   (d) sintering the granules at a temperature less than about 1150° C., the density of the granules after sintering being approximately equal to their maximum theoretical density;
   (e) if the mean particular size of the granules is above about 100 microns, milling the granules so that their mean particle size is in the range from about 1 micron to about 100 microns, said milling being performed either before or after the granules are sintered; and
   (f) blending the granules with a curable resin to form the encapsulating composition, the granules comprising between about 10 and about 80 percent by weight of the composition.

2. The method of claim 1 wherein the gel and/or the granules are treated with oxygen during at least a portion of step (c) to remove organic materials.

3. The method of claim 1 wherein the solution of step (a) contains tetraethylorthosilicate having the formula $Si(OC_2H_5)_4$.

4. The method of claim 1 wherein the curable resin is an epoxy resin and the granules are blended with the resin, a hardener, and a catalyst.

5. An encapsulating composition comprising a blend of effective amounts of a curable resin and a silica filler which is composed of fused silica granules prepared from a gel of a silicon-containing organic compound having the formula $Si(OR)_4$ or $SiR(OR)_3$, where R is an alkyl group, said granules having a uranium content of less than about 0.1 parts per billion and a thorium content of less than about 0.5 parts per billion and comprising between about 10 and about 80 percent by weight of the composition.

6. The encapsulating composition of claim 5 wherein the granules will pass through a 325 mesh screen, but will not pass through a 600 mesh screen.

7. The encapsulating composition of claim 5 wherein the silicon-containing organic compound is tetraethylorthosilicate having the formula $Si(OC_2H_5)_4$.

8. The encapsulating composition of claim 5 wherein the curable resin is an epoxy resin and the blend includes the granules, the resin, a hardener, and a catalyst.

9. The encapsulating composition of claim 5 wherein the granules will pass through a 325 mesh screen, but will not pass through a 600 mesh screen, the silicon-containing organic compound is tetraethylorthosilicate having the formula $Si(OC_2H_5)_4$, the curable resin is an epoxy resin, and the blend includes the granules, the resin, a hardener, and a catalyst.

* * * * *